(12) United States Patent　　(10) Patent No.: US 9,029,740 B2
Aguilar et al.　　(45) Date of Patent: May 12, 2015

(54) AIR IMPINGEMENT HEATER

(71) Applicant: Nordson Corporation, Westlake, OH (US)

(72) Inventors: Stanley C. Aguilar, El Cajon, CA (US); David N. Padgett, Carlsbad, CA (US)

(73) Assignee: Nordson Corporation, Westlake, OH (US)

( * ) Notice: Subject to any disclaimer, the term of this patent is extended or adjusted under 35 U.S.C. 154(b) by 161 days.

(21) Appl. No.: 13/741,941

(22) Filed: Jan. 15, 2013

(65) Prior Publication Data

US 2014/0197153 A1　Jul. 17, 2014

(51) Int. Cl.
　　*H05B 1/02*　　(2006.01)
　　*H05B 1/00*　　(2006.01)
　　*B23K 1/012*　　(2006.01)
　　*B23K 3/047*　　(2006.01)
　　*H05K 3/34*　　(2006.01)

(52) U.S. Cl.
　　CPC .... *H05B 1/00* (2013.01); *B23K 1/012* (2013.01); *B23K 3/0478* (2013.01); *H05K 3/3494* (2013.01)

(58) Field of Classification Search
　　CPC .... B23K 1/012; B23K 3/0478; H05K 3/3494; H05B 1/00; H05B 3/22; H05B 3/68; H05B 2203/005; H05B 1/0233; H05B 3/0047
　　USPC .......... 219/482, 497, 486, 85.1, 85.18, 85.21; 118/725; 392/360, 379; 438/106, 108
　　See application file for complete search history.

(56) References Cited

U.S. PATENT DOCUMENTS 5,459,300 A * 10/1995 Kasman ............ 219/433
5,467,912 A　　11/1995 Mishina et al.
7,304,264 B2 * 12/2007 Roy ............ 219/121.43
7,826,724 B2　　11/2010 Cunningham et al.
2003/0157563 A1 *　8/2003 Danssaert et al. ............ 435/7.1
2003/0194833 A1 * 10/2003 Quinones et al. ............ 438/108
2004/0197950 A1 * 10/2004 Jensen ............ 438/106
2006/0200965 A1 *　9/2006 Farooq et al. ............ 29/426.3
2009/0223937 A1 *　9/2009 Wang et al. ............ 219/85.13
2011/0042369 A1 *　2/2011 Ishiguro et al. ............ 219/539
2014/0076878 A1 *　3/2014 Shimura ............ 219/216

FOREIGN PATENT DOCUMENTS

| EP | 2374567 A1 | 10/2011 |
|---|---|---|
| JP | H036890 Y2 | 2/1991 |
| JP | H03216271 A | 9/1991 |
| JP | H04164388 A | 6/1992 |
| JP | H04288963 A | 10/1992 |

OTHER PUBLICATIONS

European Patent Office, search report and written opinion issued in International application No. PCT/US2013/069543 dated Apr. 14, 2014.

* cited by examiner

*Primary Examiner* — Mark Paschall
(74) *Attorney, Agent, or Firm* — Wood, Herron & Evans, LLP

(57) ABSTRACT

Apparatus and methods for heating of one or more substrates with a plurality of independently controllable heating zones. Pressurized air is provided to each of a plurality of independently controlled heater blocks each including a heating element. The pressurized air is heated in the heater blocks and discharged towards one or more regions of the one or more substrates. The amount of power provided to the heating element in one of the heating blocks may be adjusted relative to the amount of power provided to the heating element in another of the heating blocks. The temperature of one heating zone may thereby be adjusted relative to other heating zones so that the temperature of different heating zones for the one or more substrates may be independently controlled. Heated air may be recovered from the heating zones and recycled. The pressurized air may be preheated by passing through a lift plate.

34 Claims, 13 Drawing Sheets

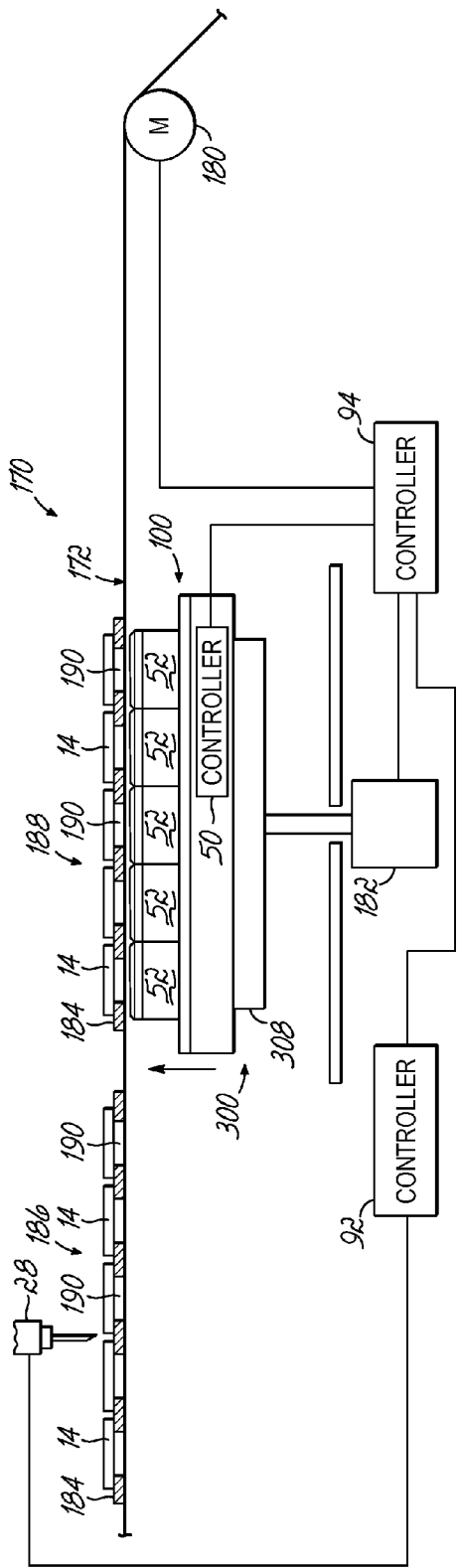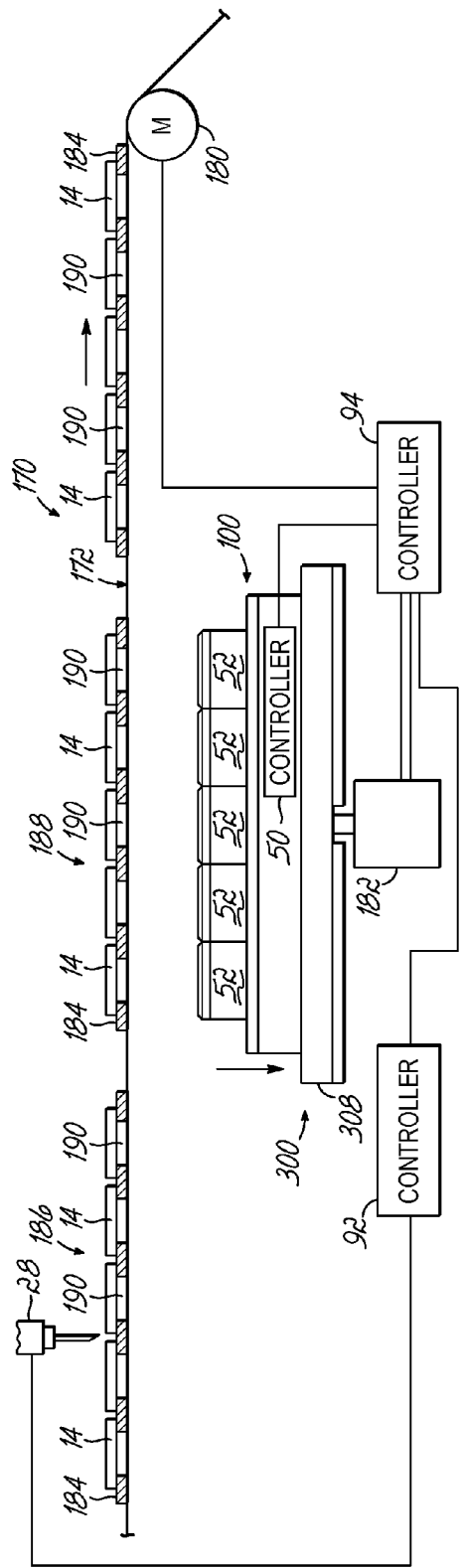

AIR IMPINGEMENT HEATER

TECHNICAL FIELD

This invention relates generally to an apparatus and methods of heating substrates in the electronics industry and, more particularly, to an apparatus and methods of heating a substrate with heated air that includes independently controllable heating zones.

BACKGROUND

In the microelectronics industry, fabrication of electrical devices typically includes one or more steps that involve heating a substrate, circuit board, and/or lead frame. For example, a packaged integrated circuit may be fabricated by mounting a die carrying the integrated circuit on a package carrier that provides electrical connections from the die to the exterior of the package. The die includes an area array of electrically-conductive contacts, or bond pads, that are electrically connected to a corresponding area array of conductive contacts on the package carrier, known as solder balls or bumps. Typically, the solder bumps are registered with the bond pads and a reflow process is applied to create electrical connections in the form of solder joints between the die and the package carrier by heating the package. Similarly, electronic components may be electrically coupled to a circuit board by placing the components on the circuit board so that the components are positioned with electrical leads on contact pads that have been coated with a solder paste. The circuit board may then be heated so that the solder paste melts or reflows, thereby coupling the electronic components to the circuit board.

To improve the durability of electrical devices, the gap between the die, package carrier, and/or circuit board is commonly filled with an encapsulant material. Underfilling with encapsulant material may increase the ability of the electrical device to withstand mechanical shock and vibration, protect electrical connections from environmental conditions, and provide improved thermal coupling between the mounted device and the underlying substrate. One method of underfilling involves dispensing a low-viscosity encapsulant material with strong wetting characteristics along a side edge of the gap so that the encapsulant is drawn into the gap by surface tension wetting or capillary action. To improve flow, the viscosity of the encapsulant material may be reduced and the flow rate increased by pre-heating the substrate before the encapsulant material is dispensed onto the substrate. The substrate may be also be heated to cure the encapsulant after the encapsulant has flowed into the gap.

Consequently, there is a need for improved apparatuses and methods for heating substrates in the electronics industry.

SUMMARY

In one embodiment, an apparatus for processing a substrate is provided. The apparatus includes a heater including a plurality of heater blocks, and a controller coupled with the heater. The controller is configured to independently adjust an amount of heat supplied from each heater block of the heater to the one or more substrates.

In another embodiment, a method of processing a substrate is provided. The method includes independently adjusting an amount of heat supplied from each of a plurality of heater blocks to the one or more substrates.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the principles of the invention.

FIGS. 12 and 13 are diagrammatic views illustrating a substrate processing system that includes the heater and lift assembly of FIG. 10.

DETAILED DESCRIPTION

Embodiments of the present invention include an apparatus and methods for heating a substrate with a plurality of separately controlled heating zones. The heater includes a support assembly having an air plenum and a plurality of heater blocks. Each heater block is configured to provide an independently controlled heating zone, and includes a heating element that heats air provided from the plenum of the support assembly. The air provided to the each of the heater blocks is heated by the heater block and impinged on a portion of the substrate to warm that portion of the substrate. Each heater block may also include one or more air plenums and an impingement plate that work cooperatively to direct heated air towards the substrate being processed, and a temperature sensor that provides feedback to a controller. A compliant member or gasket may be coupled to one or more of the heater blocks so that the gasket is located between the impingement plate and the substrate. The gasket may thereby confine impinged air to the portion of the substrate being heated by the one or more heater blocks, while permitting enough leakage to prevent excess pressurization. The heater may also include an air recovery system that recycles heated air. The air recovery system may recover air that has leaked past the gasket, or may recover air from the region between the impingement plate and the substrate by drawing air back into the heater block through openings in the impingement plate.

The heater may be supported by a lift assembly that houses the controller. The lift assembly may selectively raise and lower the heater with a lift plate that is coupled to the heater. The lift plate may include a passage that couples unheated air to the heater. The passage may have a circuitous path through the lift plate so that the air flowing through the passage cools the lift plate. The passage may thereby reduce the amount of heat transferred from the heater to the lift assembly through the lift plate. The air flowing through the passage may thereby be pre-heated, which may reduce the amount of heat the heater must produce to heat the air to a desired temperature. The controller may be mounted to the lift plate, and is operatively coupled to each of the heating elements and temperature sensors. The controller may adjust the heat generated by each heating element to independently control the temperature of the heating zone corresponding to that element. The control over the temperature of each heating zone is accomplished without controlling the air flow inside the heater or individually controlling the air flow at the heater blocks. The only air flow control is provided external to the heater.

Figure 1:
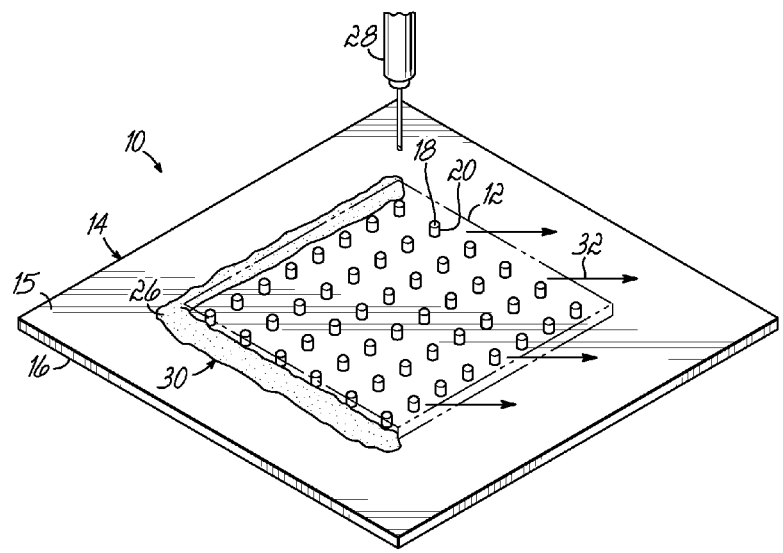
FIG. 1 is a perspective view of a package assembly of a die, shown in phantom, and a substrate during an underfilling operation.
Figure 2:
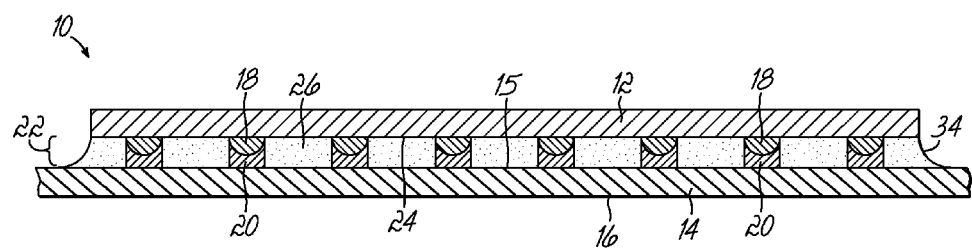
FIG. 2 is a cross-sectional view of the package assembly of FIG. 1 following an underfilling operation.

With reference to FIGS. 1 and 2, a semiconductor device package 10 may include a die 12 mounted on a package carrier or substrate 14 in a flip chip mounting arrangement. The substrate 14 may have a top surface 15 and a bottom surface 16, and comprise an organic or ceramic substrate material such as a printed circuit board, a flip chip multi-chip module, or a flip chip carrier. The die 12 may be electrically and mechanically connected to the substrate 14 through an area array of solder bumps 18 on the underside of the die 12 that are registered or aligned with a corresponding array of solder pads 20 on the substrate 14. Upon heating, the solder pads 20 on the substrate 14 reflow and physically connect with the solder bumps 18 of die 12 to provide mechanical, thermal, and electrical coupling between the die 12 and substrate 14 in the form of solder joints. With this mounting arrangement, a gap 22 may be formed between a contact side 24 of die 12 and the top surface 15 of the substrate 14.

The gap 22 may be filled with an encapsulant material 26, such as a liquid epoxy, by depositing the encapsulant material 26 along one or more sides of the die 12 so that the encapsulant material 26 is drawn into the gap 22. As illustrated in FIG. 2, the encapsulant material 26 may be provided from a fluid dispenser 28 as an L-shaped bead 30 dispensed onto the surface of the substrate 14 proximate to the gap 22 and on two contiguous sides of the die 12. Although embodiments of the invention are described for use with an L-shaped bead, other suitable bead shapes may be used. For example, a single line of encapsulant material 26 may be disposed along one side edge of die 12 or a U-shaped bead of encapsulant material 26 may be disposed along three side edges of die 12. The amount of encapsulant material 26 in bead 30 may depend upon the desired fillet volume and the under-die volume, which is determined by the size of the die 12 and the height tolerances of the solder junctions created between bumps 18 and pads 20. The encapsulant material 26 may flow or move into the gap 22, as indicated generally by arrows 32, under capillary action or with forced assistance. Once the encapsulant material 26 has fully encapsulated all of the electrical interconnections provided by the solder joints defined by solder pads 20 and solder bumps 18, the flow of the encapsulant material 26 may cease. A fillet 34 may thereby be formed along the side edges of the die 12, and the encapsulant material 26 may be hardened or cured, such as by heating the substrate 14.

Figure 3:
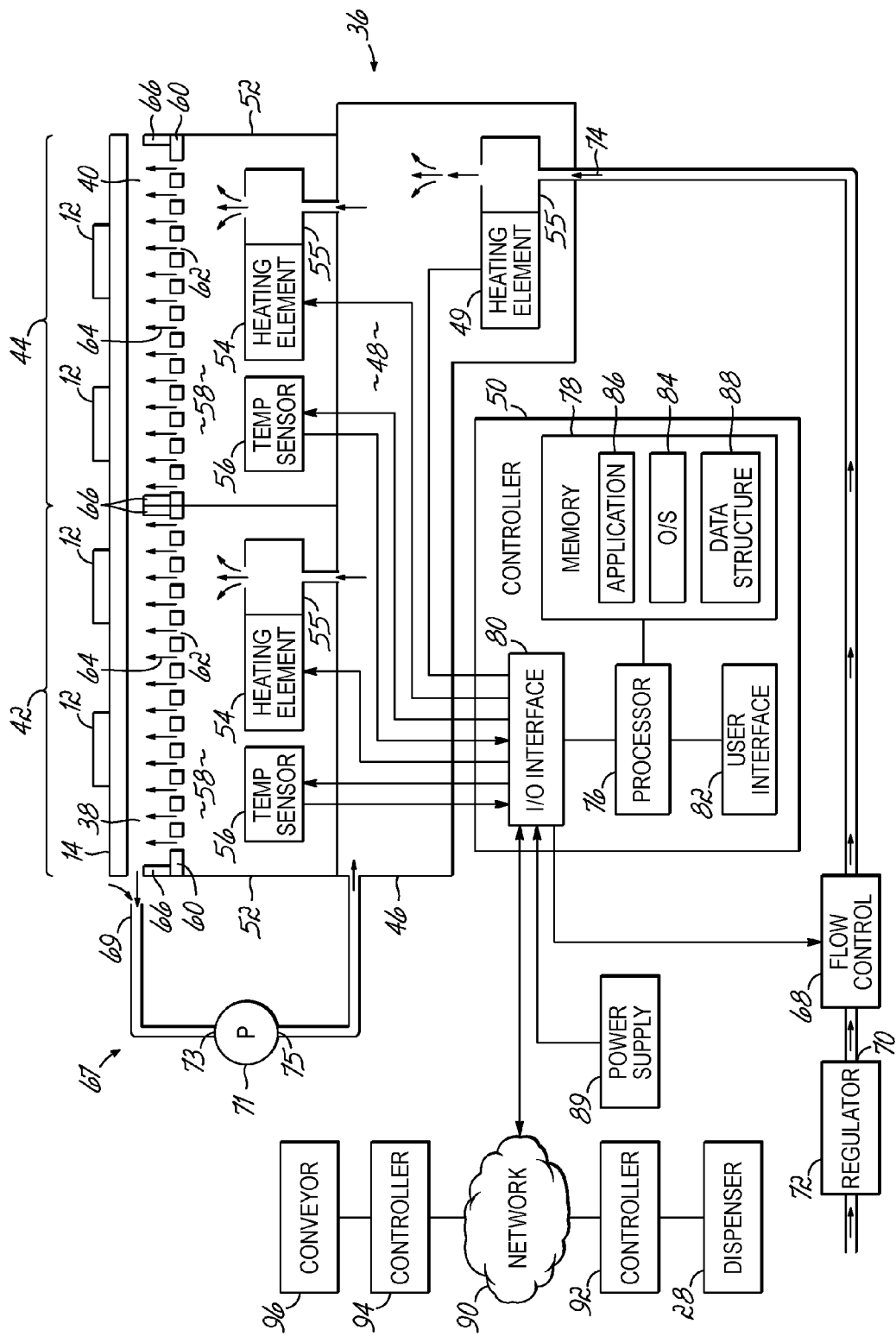
FIG. 3 is a block diagram showing a non-contact heating system configured to heat a substrate.

FIG. 3 is a block diagram illustrating a heater 36 having a plurality of impingement heating zones 38, 40 each configured to heat a corresponding portion 42, 44 of substrate 14. Although the exemplary embodiment is illustrated as having two heating zones 38, 40 that heat a single substrate 14 for purposes of clarity, persons having ordinary skill in the art will understand that other numbers of heating zones 38, 40 and/or substrates 14 may be provided. The invention is therefore not limited to a particular number of heating zones or substrates. Each individual substrate may be held in a process carrier, such as an Auer boat or a JEDEC carrier.

The heater 36 includes a support assembly 46 having a plenum 48, and a plurality of heater blocks 52. The support assembly 46 may also include one or more heaters 49 that provide heat to the air in the plenum 48 so that the air is pre-heated before entering the heater blocks 52. Each heater block 52 may include a heating element 54 thermally coupled to a heat exchanger 55 and a temperature sensor 56, such as a resistance temperature detector (RTD). A controller 50 may control the temperature of each heating block independently by selectively activating the heating element 54 of the heating block 52 based on signals from the corresponding temperature sensor 56.

Each heater block 52 may also include a plenum 58 and an impingement plate 60 positioned between the plenum 58 and the substrate 14. The impingement plate 60 includes a plurality of openings 62 through which heated air (represented by arrows 64) passes from the plenum 58 of the heater block 52 into the respective impingement heating zone 38, 40. Each heater block 52 may also include a compliant member 66, such as a gasket that snaps over a retaining lip (not shown) on an outer edge of the heater block 52. The compliant member 66 may project generally upward from the outer edge of the heater block 52 toward the substrate 14. The edge of the compliant member 66 may contact the overlying substrate 14 or may be slightly spaced from, but proximate to, the substrate 14. The compliant member 66 may thereby confine the heated air 64 to a region between the substrate 14 and the impingement plate 60 of the heater block 52 that corresponds to the respective heating zone 38, 40. The compliant member 66 may include slits (not shown) in the corners, or another escape path, for the heated air 64 that may operate to prevent excess pressurization of the region between the substrate 14 and the impingement plate 60 of the heater block 52. The heater 36 may thereby heat the substrate 14 to a desired temperature with a lower air flow rate as compared to heaters lacking the compliant member 66. This reduction in the air flow rate may reduce the amount of pressurized air consumed by the heater 36, and the amount of waste heat or thermal pollution released into the processing facility.

In an embodiment of the invention, heated air escaping from the region between the substrate 14 and impingement plate 60 may be collected by an optional air recovery system 67. The air recovery system 67 may include an air intake 69 coupled to the plenum 48 by an air pump 71 having an intake port 73 and an output port 75. In response to activating the air pump 71, the air recovery system 67 may draw heated air 64 escaping from the region between the substrate 14 and the impingement plate 60 into the air intake 69, and return this air to the plenum 48. Captured air may thereby be recycled into the heater 36. In an alternative embodiment, one or more air intakes 69 may be located in the impingement heating zones 38, 40 so that heated air 64 is removed from the region between the substrate 14 and impingement plate 60 before leaking past the gasket 66. By removing air directly from the impingement heating zones 38, 40, the air recovery system 67 may allow pressure in the region between the substrate 14 and impingement plate 60 to be controlled independently of the flow rate of the heated air 64. The improved control over air pressure in the impingement heating zones 38, 40 provided by the air recovery system 67 may reduce the amount of heated air 64 that leaks past the gasket 66, as compared to heaters 36 lacking the air recovery system 67. The air recovery system 67 may thereby further reduce the demand for pressurized air 74, and the amount of thermal pollution released into the processing facility.

The controller 50 may include a processor 76, a memory 78, an input/output (I/O) interface 80, and a user interface 82. The processor 76 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 78. Memory 78 may be a single memory device or a plurality of memory devices including but not limited to read-only memory (ROM), random access memory (RAM), volatile memory, non-volatile memory, static random access memory (SRAM), dynamic random access memory (DRAM), flash memory, cache memory, or any other device capable of storing information. Memory 78 may also include a mass storage device (not shown) such as a hard drive, optical drive, tape drive, non-volatile solid state device, or any other device capable of storing digital information.

Processor 76 may operate under the control of an operating system 84 that resides in memory 78. The operating system 84 may manage controller resources so that computer program code embodied as one or more computer software applications, such as a controller application 86 residing in memory 78 may have instructions executed by the processor 76. In an alternative embodiment, the processor 76 may execute the applications 86 directly, in which case the operating system 84 may be omitted. One or more data structures 88 may also reside in memory 78, and may be used by the processor 76, operating system 84, and/or controller application 86 to store or register data, such as heating zone temperature data or substrate processing parameters and programs.

The I/O interface 80 operatively couples the processor 76 to other components of the heater 36, including the support assembly heater 49, the heating elements 54 and temperature sensors 56 of heater blocks 52, and the air pump 71 of air recovery system 67 (if present). The I/O interface 80 may also couple the processor 76 to an external power supply 89 and a network 90 that connects the controller 50 of heater 36 to other controllers. For example, the controller 50 of heater 36 may be communicatively coupled to a controller 92 that controls the fluid dispenser 28, and/or a system controller 94 that controls a conveyor 96 configured to transport substrates 14 to and from the heater 36. The controller application 86 may thereby be configured to work cooperatively with other applications (not shown) to automate processing of the substrate 14 in a substrate processing system that includes the fluid dispenser 28 and the heater 36. The controller application 86 may also have program code that is executed in one of the other controllers 92, 94, or otherwise rely on functions and/or signals provided by other system components external to the heater 36. Indeed, given the nearly endless hardware and software configurations possible, persons having ordinary skill in the art will understand that embodiments of the invention may include heater control applications that are located externally to the heater, distributed among multiple controllers, or integrated into system controllers that control multiple processing systems.

The I/O interface 80 may include signal processing circuits that condition incoming and outgoing signals so that the signals are compatible with both the processor 76 and the components to which the processor 76 is coupled. To this end, the I/O interface 80 may include analog-to-digital (A/D) and/or digital-to-analog (D/A) converters, voltage level and/or frequency shifting circuits, optical isolation and/or driver circuits, silicon-controlled rectifier (SCR) or power devices for selectively coupling the heating elements 54 to the power supply 89, and/or any other analog or digital circuitry suitable for coupling the processor 76 to other system components.

The user interface 82 may be operatively coupled to the processor 76 of controller 50 in a known manner to allow a system operator to interact directly with the controller 50. The user interface 82 may include video and/or alphanumeric displays, a touch screen, a speaker, and any other suitable audio and visual indicators capable of providing information to the system operator. The user interface 82 may also include input devices and controls such as an alphanumeric keyboard, a pointing device, keypads, pushbuttons, control knobs, microphones, etc., capable of accepting commands or input from the operator and transmitting the entered input to the processor 76. In this way, the user interface may enable manual initiation of system functions, for example, during set-up or calibration of the heater 36, and to select or load a substrate processing program.

The temperature sensors 56 may be thermocouples or RTDs that are each configured to generate a signal indicative of an actual temperature of the corresponding heater block 52. Each temperature sensor 56 may be thermally coupled to the heat exchanger 55, air in the plenum 58, or to any other portion of the respective heater block 52 for providing temperature data to the controller application 86. The controller application 86 may be configured to control the temperature of each heater block 52 by adjusting the amount of power provided to each heating element 54 based on the temperature feedback signal received from the corresponding temperature sensor 56. To this end, the controller application 86 may implement a suitable temperature control algorithm, such as a proportional-integral-derivative (PID) or thermostatic control algorithm.

The controller application 86 may adjust the amount of power supplied to each heating element 54 based on a difference between the actual temperature indicated by the temperature sensor 56 and a desired temperature set-point of that heater block 52. The controller application 86 may also adjust the amount of power supplied to the support assembly heater 49 to control the temperature on a global scale. The power supplied to the heater 49 and/or heating elements 54 may be controlled using pulse width modulation (PWM) to selectively couple the heating elements to the power supply 89. In the case of thermostatic control, the controller application 86 may simply cycle the heating element 54 on and off based on the received temperature feedback signal for that heater block 52. The controller 50 may also be operatively coupled to a flow control valve 68 that fluidically couples an output 70 of a pressure regulator 72 to the plenum 48 of support assembly 46. By controlling the amount of cold pressurized air, or house air (represented by arrow 74) that enters the heater 36, the controller application 86 may control the amount of heated air 64 provided to the impingement heating zones 38, 40. The amount of heat provided to the substrate 14 may therefore be controlled within a heating zone 38, 40 by adjusting the individual temperature set-points of the heater blocks 52, or globally by adjusting the amount of power supplied to the support assembly heater 49 and/or the flow rate of the pressurized air 74 into the heater 36.

Because the heating element of each heater block 52 is independently controlled, the controller application 86 may adjust the heat provided to one portion of the substrate 14 relative to other portions of the substrate 14. This zonal control may allow the heater 36 to maintain temperatures across the substrate 14 at a more consistent level and improve temperature uniformity as compared to heaters lacking the plurality of heating zones 38, 40. For example, if a portion of substrate 14 includes a component that acts as a heat sink, or is near an outer edge of the substrate 14, the portion in question may tend to be cooler than other portions of the substrate 14. To compensate for this difference, the controller application 86 may be configured to provide more heat to the heater block 52 heating that portion of the substrate 14. This increase in heat may be accomplished by, for example, increasing the set point temperature of that heater block 52 relative to the other heater blocks 52.

The controller 50 may also control the operation of the support assembly heater 49, heating elements 54, and/or the flow control valve 68 as part of a substrate processing program or temperature profile resident in memory 78, or in response to instructions from one of the controllers 92, 94. As with operation of the support assembly heater 49 and heating elements 54, the controller 50 may operate the flow control valve 68 according to processing programs or flow rate profiles recalled from memory 78 that optimize the heating process. Such temperature and flow rate profiles may be determined automatically in response to a determined operating condition, or provided by one of the system controllers 92, 94. Exemplary operating conditions may include a detected temperature or an equipment operating mode. For instance, the controller 50 may determine that the heater 36 has entered a standby mode, such as when the heater 36 is waiting for a substrate 14. In response to entering a particular mode, the controller 50 may use a lookup table to determine a power level or temperature setting for the heating elements 54 and/or an airflow setting or sequence of settings for the flow control valve 68 optimized for that mode.

Figure 4:
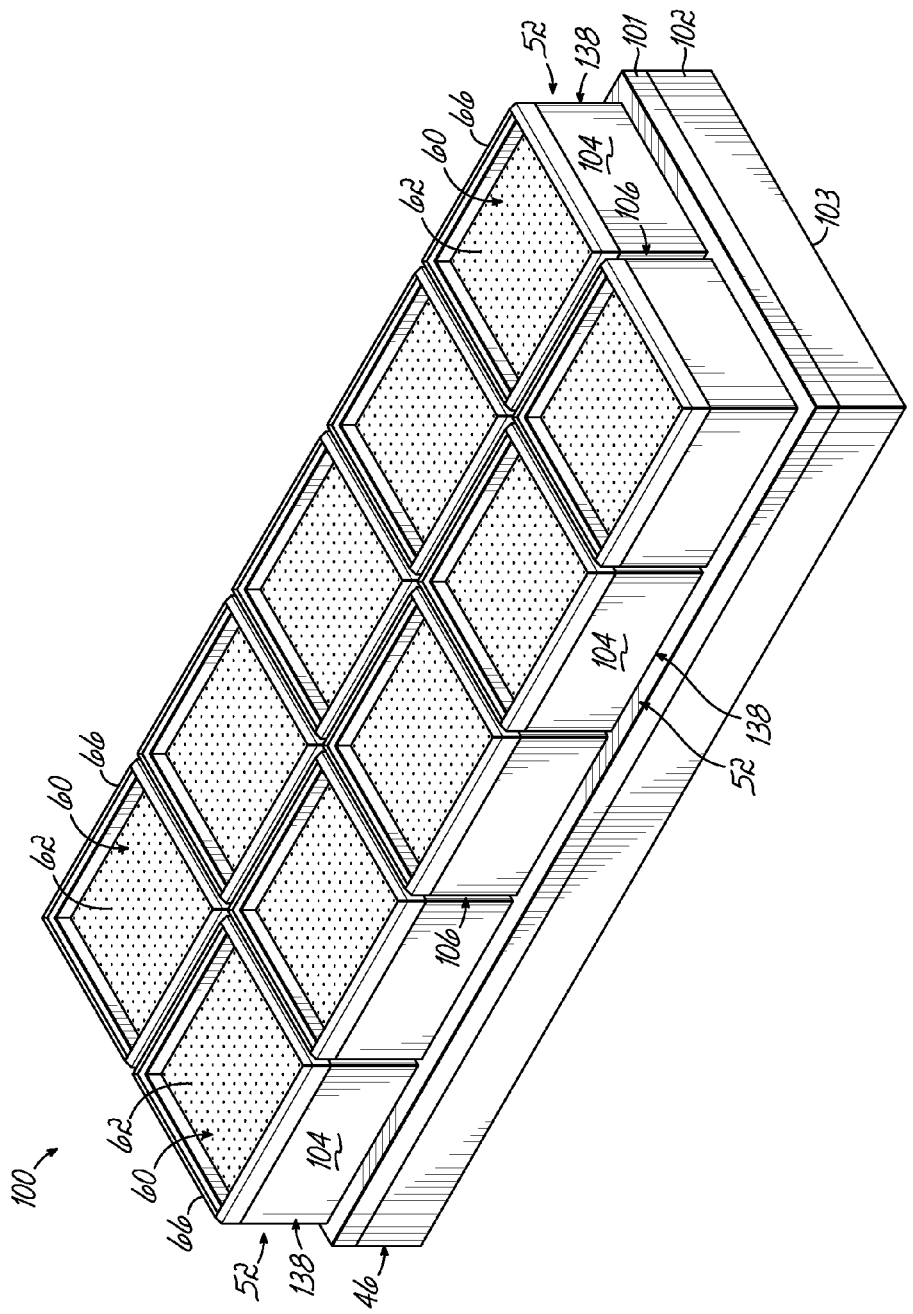
FIG. 4 is a perspective view of a heater including a plurality of heater blocks on a support assembly.
Figure 5:
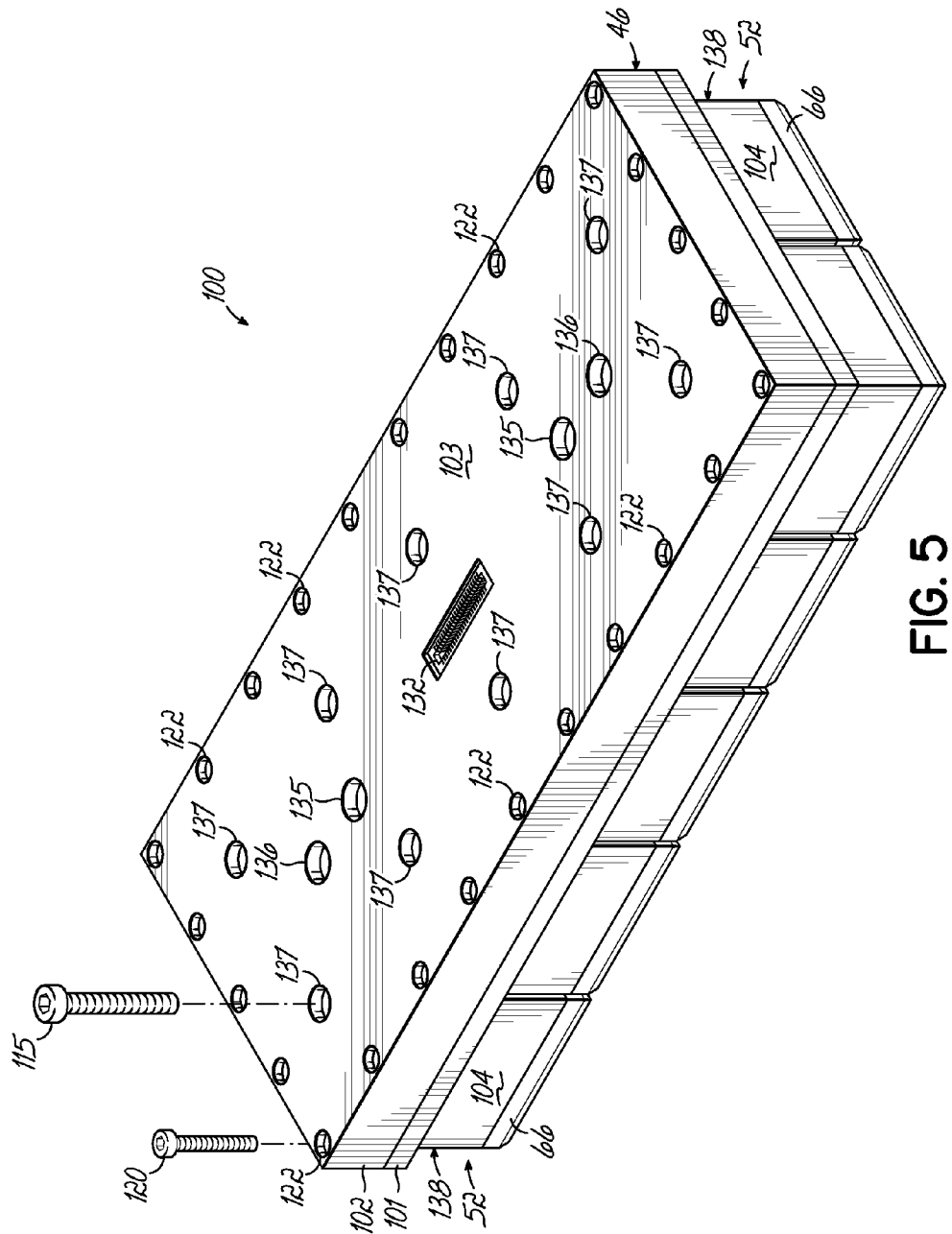
FIG. 5 is a perspective view of the bottom of the support assembly of FIG. 4.

Referring now to FIGS. 4 and 5, a heater 100 is illustrated including a plurality of heater blocks 52 in accordance with an embodiment of the invention. The support assembly 46 includes a top plate 101 configured to accept the heater blocks 52, and a lower housing 102 having a bottom surface 103. The heater blocks 52 have a generally rectangular shape with vertical sides or surfaces 104, and may be arranged so that there is a space or gap 106 between the vertical surfaces 104 of adjacent heater blocks 52. In an alternative embodiment of the invention, the heater blocks 52 may be configured so that the sides 104 of adjacent blocks 52 are in contact with each other so that the gap 106 is absent.

Figure 6:
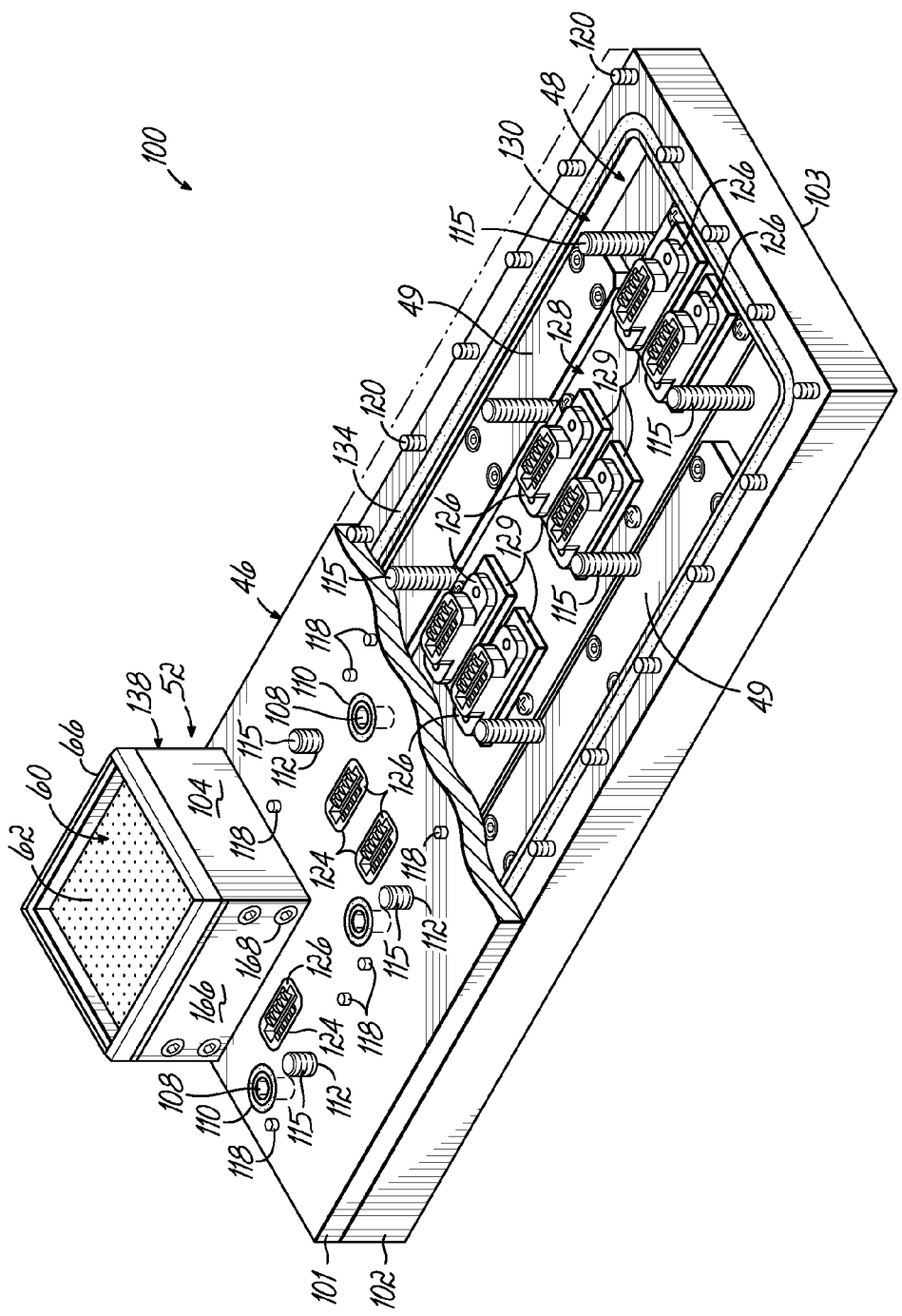
FIG. 6 is a perspective view of the heater in FIG. 4 with a portion of a top plate cut-away to reveal internal details of the support assembly.

Referring now to FIG. 6, and with continued reference to FIGS. 4 and 5, the heater 100 is shown in a perspective cut away view with all but one of the heater blocks 52 removed to expose additional details of the support assembly 46, such as the support assembly heaters 49. The support assembly heaters 49 are thermally coupled to the lower housing 102, and may be used to raise the temperature or the support assembly 46 so that air in the plenum 48 is heated by contact with the internal surfaces of the support assembly 46. The top plate 101 includes a first plurality of openings 108 that fluidically couple air from the plenum 48 of support assembly 46 to a corresponding air inlet 148 (FIG. 9) in each of the heater blocks 52. Each opening 108 may include a circular gasket 110 that provides an air-tight seal between the top plate 101 and heater block 52.

The top plate 101 may also include a plurality of through-holes 112 that are each configured to pass a retaining bolt 115 that engages a corresponding threaded blind-hole 116 (FIG. 9) in a bottom surface 117 of each of the heater blocks 52. One or more locating pins 118 that project upward from the top plate 101 may be configured to engage matching holes 119 (FIG. 9) in the bottom surface 117 of each heater block 52 to prevent rotation of the heater block 52 as the retaining bolt 115 is tightened. The top plate 101 may further include a plurality of threaded blind-holes (not shown) that engage bolts 120 passing through a first plurality of counter sunk through-holes 122 in the lower housing 102 for securing the top plate 101 to the lower housing 102. A second plurality of openings 124 in the top plate 101 may provide access to a plurality of top facing connectors 126 on a printed circuit (PC) board 128 in the lower housing 102. A compliant member or gasket 129 may be located between each top-facing connector 126 and the PC board 128. Gasket 129 may be configured to provide an air-tight seal between top plate 101, top-facing connector 126, and PC board 128 when top plate 101 is bolted to lower housing 102. The gasket 129 may thereby prevent pressurized air from escaping from the plenum 48 of support assembly 46 through gaps between the openings 124 and top-facing connectors 126.

The lower housing 102 may include a cavity 130 that contains the PC board 128. The cavity 130 may also work cooperatively with the top plate 101 to define the plenum 48 of support assembly 46. The PC board 128 may electrically couple the plurality of top facing connectors 126 to a bottom-facing connector 132 accessible from the bottom of the support assembly 46. The top-facing connectors 126 may provide connection points for electrically coupling the heater blocks 52 to the bottom facing connector 132 via the PC board 128. The bottom facing connector 132 may, in turn, provide a connection point for coupling the controller 50 to the heater blocks 52. The controller 50 may thereby be coupled to the heating elements 54 and temperature sensors 56 of the heater blocks 52 via the top facing connectors 126, PC board 128 and bottom facing connector 132, with each connector 126 corresponding to one of the heater blocks 52.

A gasket 134 may be positioned between the top plate 101 and lower housing 102 to provide an air-tight seal therebetween. As best shown in FIG. 5, the bottom surface 103 of lower housing 102 may include alignment holes 135 configured to locate the heater 100 on a lift plate 308 (FIG. 10), and one or more air supply openings 136 for admitting the pressurized air 74 into the plenum 48 of support assembly 46. In an embodiment of the invention, the air supply openings 136 may also serve as the alignment holes 135. The lower housing 102 may also include a second plurality of counter sunk through-holes 137 that align with the through-holes 112 of top plate 101 for securing the heater blocks 52 with the retaining bolts 115. The existence of the bottom-facing connector 132 as a connection point for the electrical connection and the one or more air supply openings 136 as connection points for the pneumatic connection permits the entire heater 100 to be installed as a unit onto to the lift plate 308 and removed as a unit from the lift plate 308.

Figure 7:
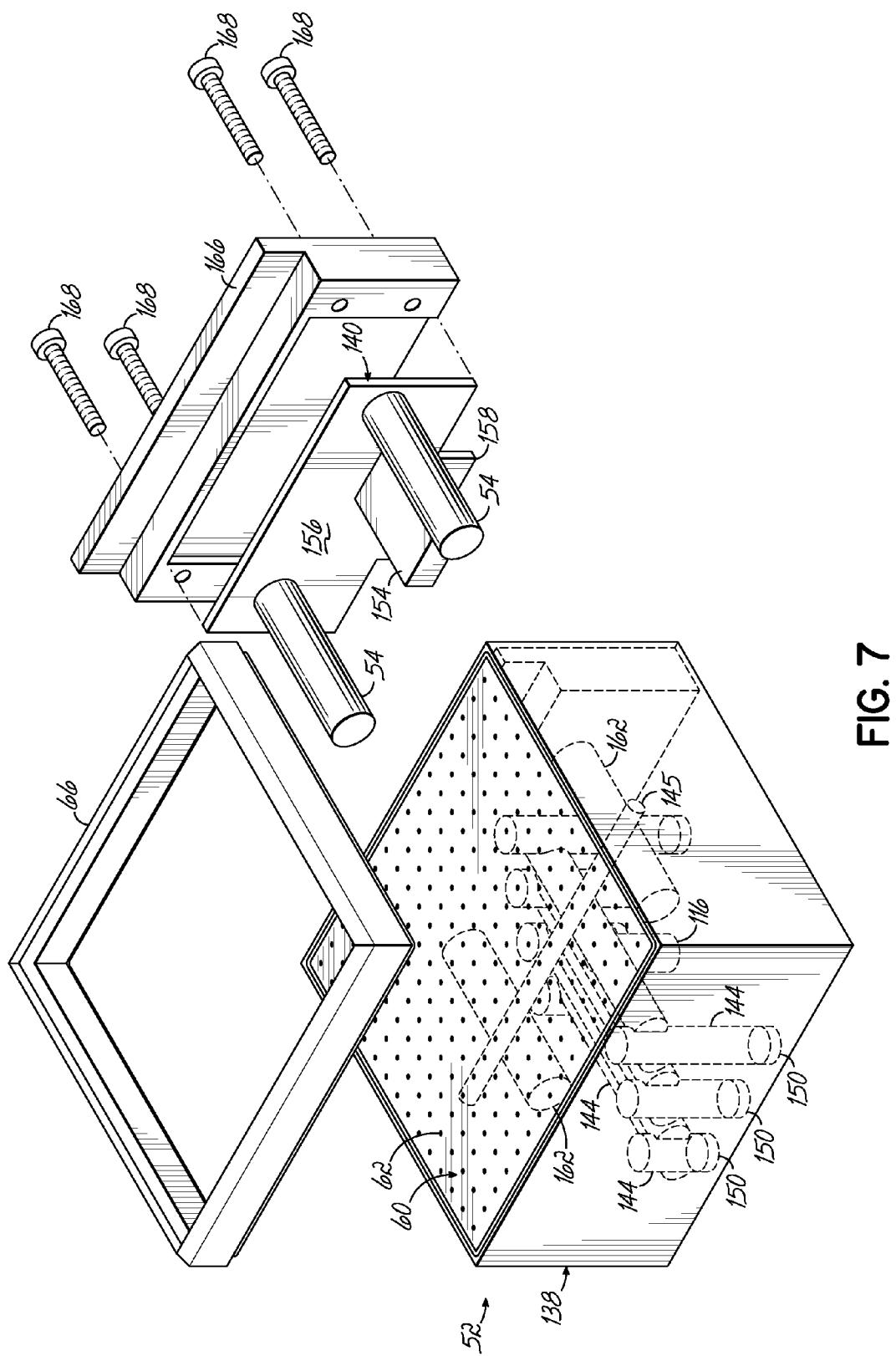
FIG. 7 is an exploded view of one of the heater blocks of FIG. 4.
Figure 8:
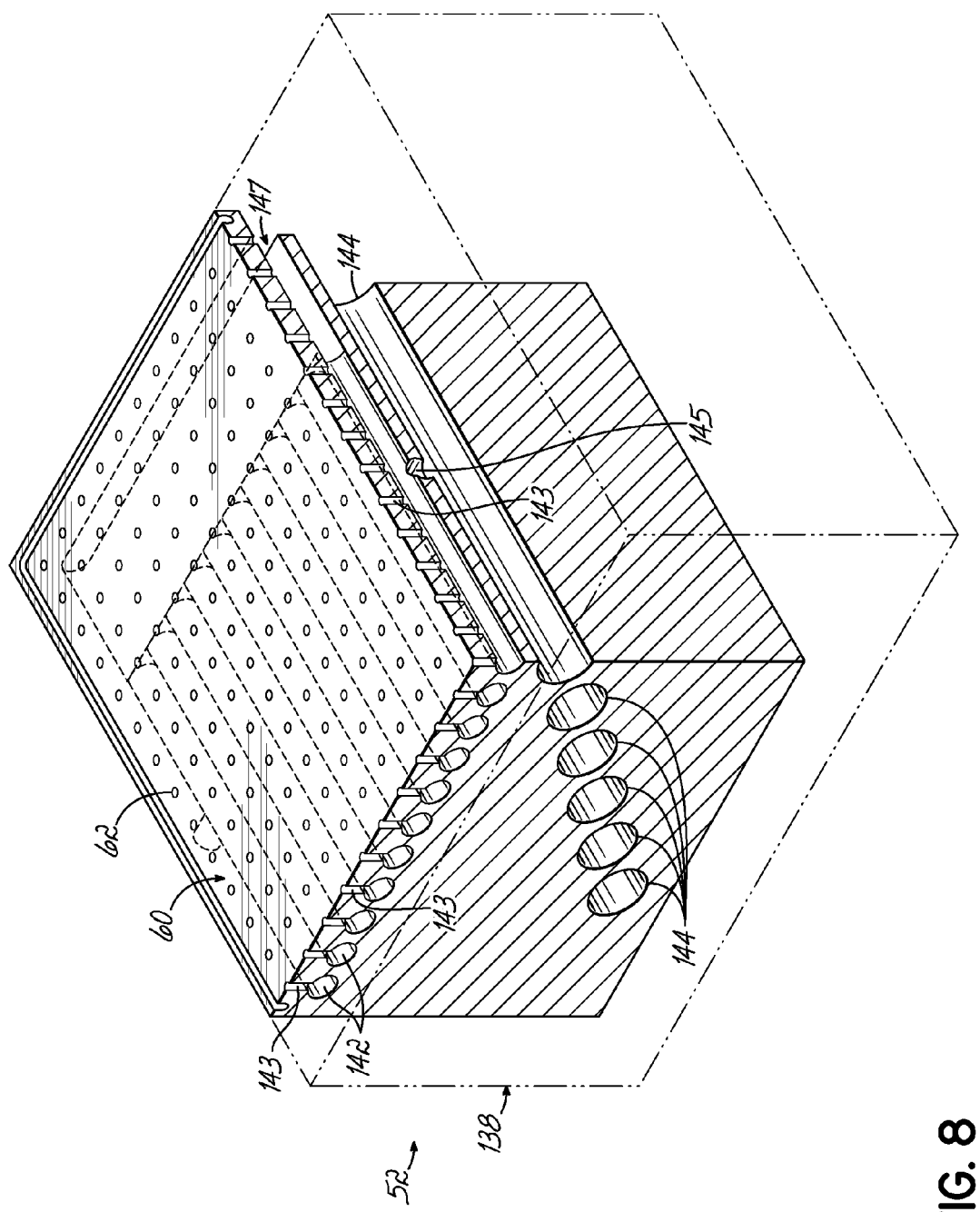
FIG. 8 is a cross-sectional perspective view of the heater block of FIG. 7.
Figure 9:
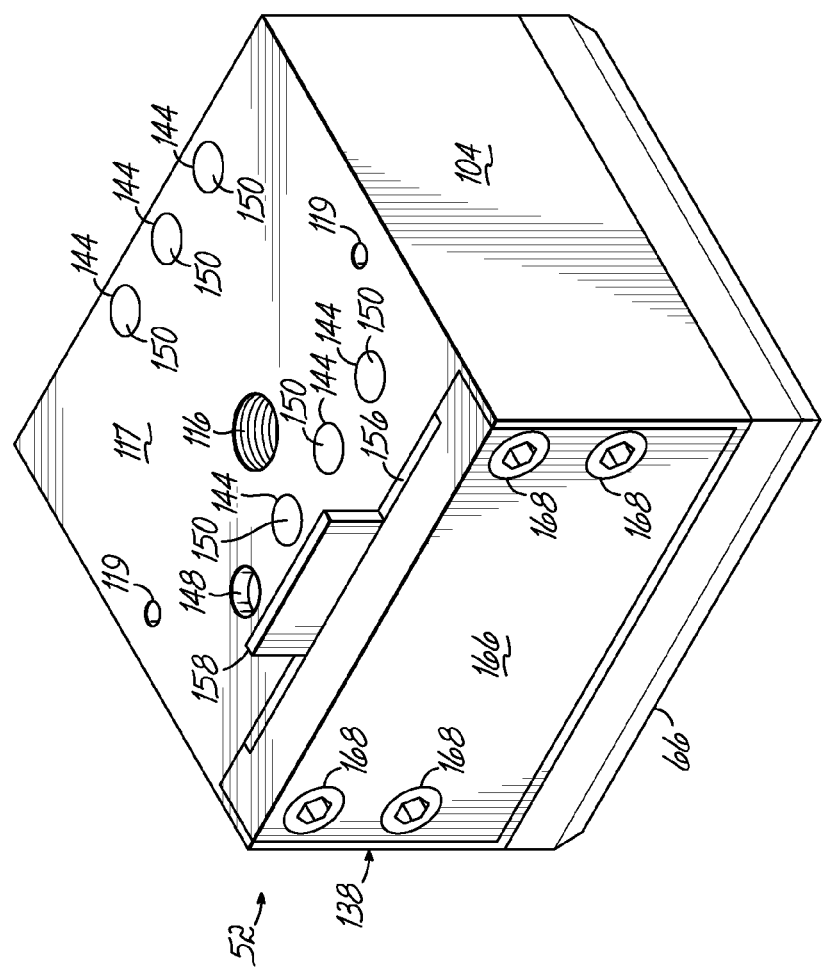
FIG. 9 is a bottom perspective view of the heater block of FIG. 7.

FIGS. 7-9 include an exploded top perspective view (FIG. 7), a cross-sectional perspective view (FIG. 8), and a bottom perspective view (FIG. 9) of the heater block 52. The heater block 52, as illustrated in the representative embodiment, includes the impingement plate 60, the compliant member 66, a body 138, and a heating element assembly 140. The body 138 of heater block 52 may be comprised of a thermally conductive material, such as aluminum. As best shown in FIG. 8, the body 138 of heater block 52 may include a plurality of plenums 142, each configured to couple heated air to a plurality of openings 143 arranged in one of a plurality of rows that collectively define the impingement plate 60. The plenums 142 of heater block 52 may be in a non-overlapping parallel arrangement spaced so that the plenums 142 do not overlap. Each row of openings 143 may thereby be supplied with heated air from one of the plurality of plenums 142.

The body 138 of heater block 52 may also include a plurality of intersecting bore holes that define a plurality of passages 144 which fluidically couple the air inlet 148 on the bottom surface 117 of body 138 to the plurality of plenums 142. In the illustrated embodiment, the passages 144 are coupled to the plenums 142 by a cross-passage 145 that runs in a generally perpendicular direction to the plenums 142 and the passages 144. So that air entering the passages 144 does not escape before reaching the openings 143, the outer ends of the passages 144 may be sealed off by plugs 150. The passages 144 may thereby provide at least a portion of the heat exchanger 55 shown in FIG. 3 by coupling heat from the body 138 of heater block 52 to air entering the air inlet 148. Further coupling of heat from the body 138 of heater block 52 to air entering the air inlet 148 may occur as the air passes through the plenums 142, the openings 143, and/or the cross-passage 145.

Each of the plenums 142 may be fluidically coupled at one end to a cavity 147. The cavity 147 may supply air to the plenums 142, help equalize pressure between the plenums 142, or may serve as part of the air intake 69 of air recovery system 67. In an alternative embodiment, the cavity 147 may extend horizontally across body 138 of heater block 52 so that the openings 143 are coupled to the plurality of passages 144 by the cavity 147, in which case the plenums 142 and cross-passage 145 may be omitted. In another embodiment, the plenums 142 may be spaced so that the diameters of the plenums 142 overlap, thereby effectively extending the cavity 147 below the impingement plate 60 to define a single plenum. The impingement plate 60 may be an integral part of the body 138 of heater block 52 (as shown), or in embodiments where the cavity 147 extends below the impingement plate 60, the impingement plate 60 may be attached to the body 138 of heater block as a separate (i.e., non-integral) piece.

In embodiments including the air recovery system 67, the plenums 142, and passages 144, 145, may be configured to that only a subset (e.g., every other plenum) of the plurality of plenums 142 is coupled to the air inlet 148. The remaining plenums 142 that are not coupled to the air inlet 148 may instead be coupled to the intake port 73 of air pump 71. The plenums 142 may thereby alternate between heated air under positive pressure and exhaust air under negative pressure. Heated air may thereby be supplied to the region above impingement plate 60 by openings 143 coupled to plenums 142 under positive pressure, and removed by openings 143 coupled to plenums 142 under negative pressure. During operation of the heater 100, the negative pressure provided to the plenums 142 may be regulated to control the pressure in the region between the substrate 14 and impingement plate 60 that corresponds to the respective heating zone 38, 40. For example, by removing sufficient air to keep the pressure of the air confined to the heating zone by the compliant member 66 about the same as the ambient pressure in the processing facility, the amount of heated air introduced into the facility may be reduced. The removed air may then be recycled into the plenum 48, thereby reducing the amount of unheated pressurized air 74 that that must be introduced into the heater 100. This reduction in unheated air 74 may in turn reduce the amount of heat that must be provided to the heater blocks 52 by the heating element assembly 140.

The heating element assembly 140 may include heating elements 54, a thermal cutoff device 154, and a printed circuit board 156 configured to electrically couple the heating elements 54 and thermal cutoff device 154 to the top facing connectors 126 via a tab 158. The threaded blind-hole 116 may be accessible from the bottom of the body 138 of heater block 52, and may be located near the center of the bottom surface 117 of heater block 52. The blind-hole 116 may be configured to receive the retaining bolt 115 so that the heater block 52 can be secured against the support assembly 46 by the retaining bolt 115.

The body 138 of heater block 52 may further include bore holes 162 configured to receive the heating elements 54 and a cavity (not shown) configured to receive the thermal cutoff device 154 of heating element assembly 140. Once inserted into the body 138 of heater block 52, the heating element assembly 140 may be held in place by a cover plate 166 that is attached to the body 138 of heater block 52 by a plurality of screws 168. The heating elements 54 may be thermally coupled to the body 138 of heater block 52 through contact with the interior surface of the bore holes 162. Activating the heating elements 54 may thereby increase the temperature of the body 138 of heater block 52 above ambient.

The resulting difference between the temperature of the air entering the air inlet 148 and the temperature of the surfaces of the passages 144 may cause heat to be transferred from the body 138 of heater block 52 to the air passing through the passages 144. This transfer of heat may increase the temperature of the air entering the plurality of plenums 142 to about the same temperature as the body 138 of heater block 52. Air entering the air inlet 148 from the plenum 48 of support assembly 46 may thereby be heated in a controlled manner by adjusting the temperature of the body 138 of heater block 52. The body 138 of heater block 52 may also provide a thermal mass that dampens changes in temperature from the heating elements 54 cycling on and off, and from changes in the flow rate or temperature of the air entering the air inlet 148.

The impingement plate 60 may be constructed by drilling or laser machining a reticulated pattern of holes in a metal sheet or the body 138 of heater block 52, as the case may be, to form the openings 143. Typical dimensions for the openings 143 are a diameter of 0.5 mm with a 5 mm pitch. In embodiments of the heater block 52 wherein the cavity 147 extends under a non-integral impingement plate 60, the impingement plate 60 may be positioned over the open side of the cavity 147 in the body 138 to define the plenum 58. In this embodiment, the plenum 58, rather than plenums 142, may distribute the heated air to the impingement plate 60. Heated air flowing into the plenum 58 may thereby be directed toward the substrate 14 by the openings 143.

The pattern with which heated air is impinged on the substrate 14 may be adjusted by the configuration of the openings 143 of impingement plate 60. As shown in FIGS. 7 and 8, the openings 143 may be distributed evenly across the impingement plate 60 so that heated air is evenly impinged on the substrate 14. However, in alternative embodiments, the openings 143 may be unevenly distributed so that more heated air is impinged on some portions of the substrate 14 than others. Opening size and/or density may also be adjusted to compensate for uneven air pressure in the plenums 142, such as may result due to lower air pressure in regions of the plenums 142 that are more distant from the air inlet 148.

Figure 10:
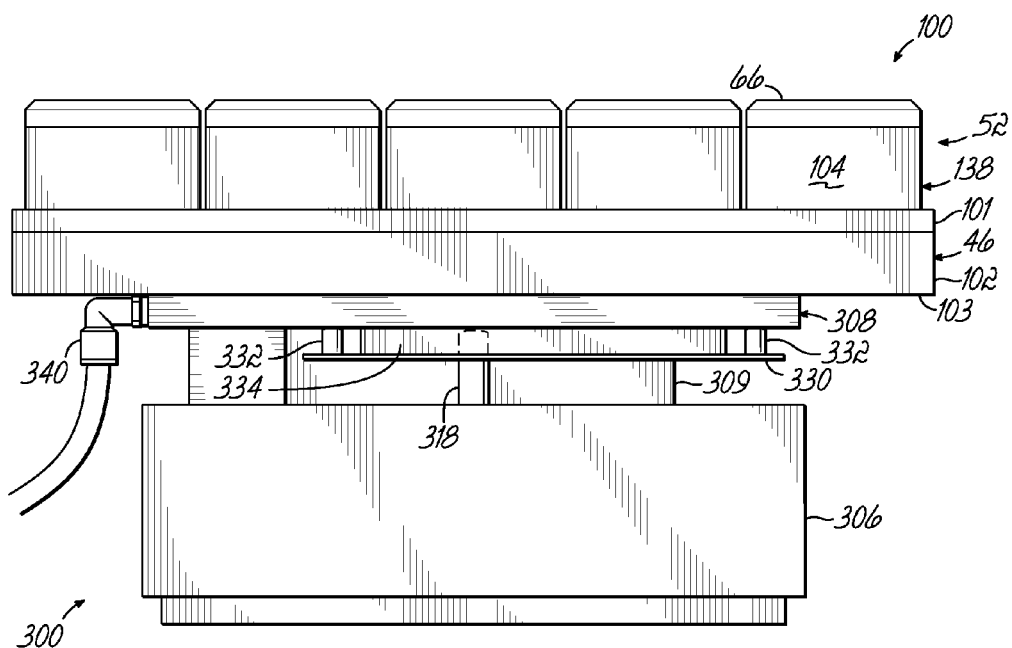
FIG. 10 is a front view of the heater of FIG. 4 installed on a lift assembly.
Figure 11:
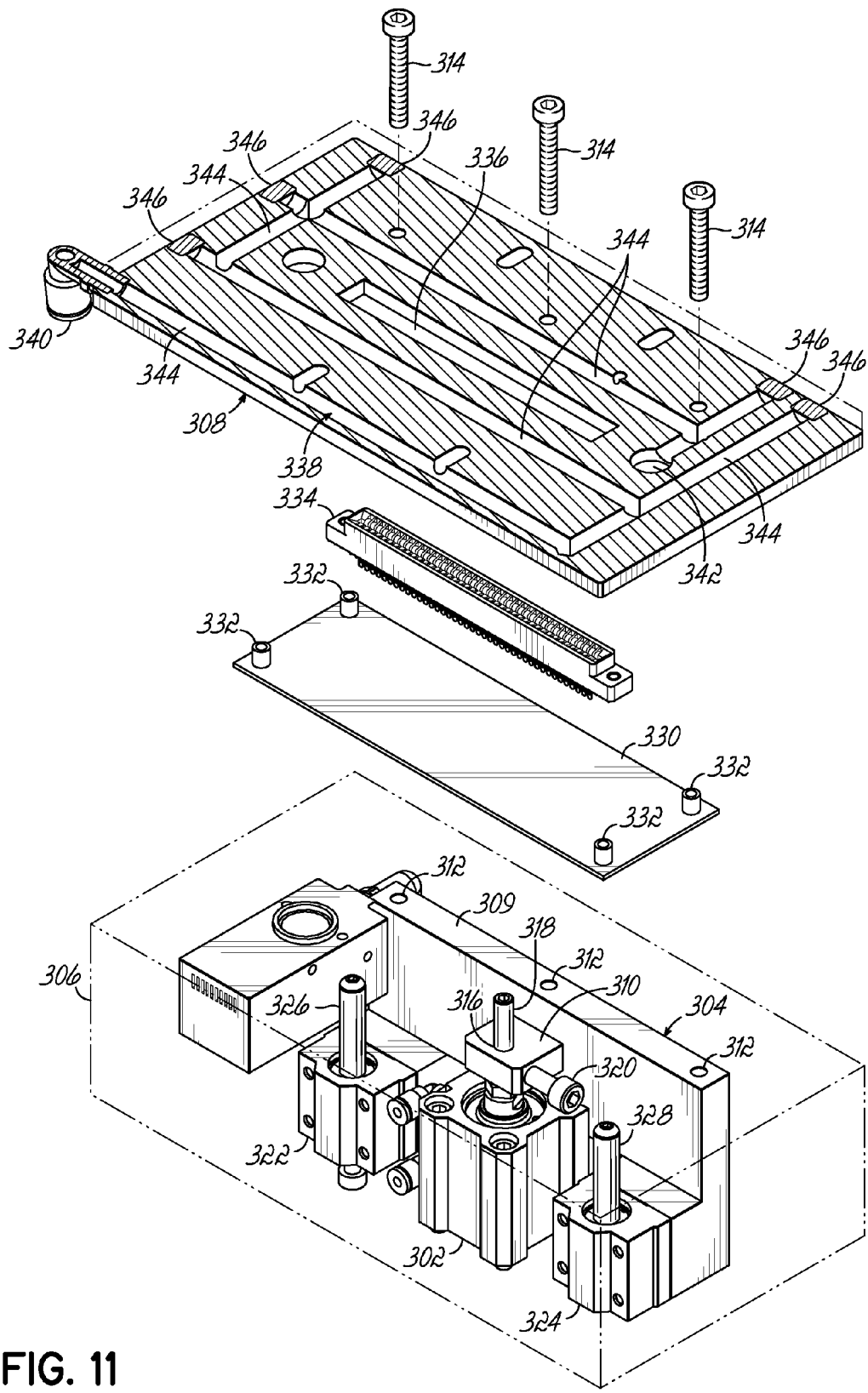
FIG. 11 is an exploded view of the lift assembly of FIG. 10.

Referring now to FIGS. 10 and 11, a lift assembly 300 is illustrated in a front view while supporting the heater 100 in a raised position (FIG. 10), and in an exploded perspective view (FIG. 11). The lift assembly 300 may include a pneumatic cylinder 302 and a lift member 304 located in a housing 306, and a lift plate 308 configured to receive the heater 100. The lift member 304 may include a carrier 309 having a boss 310 that projects outward horizontally, and a plurality of threaded holes 312 configured to receive bolts 314 that secure the lift plate 308 to the lift member 304. The boss 310 may include an aperture 316 configured to accept a piston rod 318 of the pneumatic cylinder 302, and a set screw 320 that secures the piston rod 318 within the aperture 316. The set screw 320 may allow the height of the lift member 304 to be adjusted by positioning the lift plate 308 at a desired height, and then tightening the set screw 320 to fix the position of the piston rod 318 within the boss 310. The set screw 320 may thereby provide a means of adjusting the height of the lift plate 308 so that the heater 100 is positioned accurately in relation to the substrate 14 when the lift assembly 300 is in the raised position. The lift member 304 may also include first and second slides 322, 324 coupled to the carrier 309. The first and second slides 322, 324 may engage first and second guide rods 326, 328 that locate the lift member 304 laterally while allowing the lift member 304 to be moved vertically by the pneumatic cylinder 302. The controller 50 may be provided in the form of a controller board 330 that is coupled to the bottom of lift plate 308 by stand offs 332. The controller board 330 may include a connector 334 configured to engage the bottom facing connector 132 of support assembly 42 through a slot 336 in lift plate 308. The controller board connector 334 may thereby electrically couple the controller 50 to the PC board 128, which in turn electrically couples the controller 50 to the heater blocks 52.

As best shown in FIG. 11, the lift plate 308 may be configured to couple the pressurized air 74 to one or more of the air supply openings 136 in the lower housing 102. To this end, the lift plate 308 may include a passage 338 that couples a pneumatic connector 340 to one or more an air outlets, shown in the representative embodiment as a single air outlet 342 that aligns with the air supply opening 136 in the lower housing 102. The passage 338 may be defined by a plurality of intersecting cross-drilled holes 344. Plugs 346 may be inserted into the exposed ends of the cross-drilled holes 344 to prevent the pressurized air 74 from escaping from the passage 338. As the pressurized air 74 passes through the passage 338, the pressurized air 74 may absorb heat from the lift plate 308. The pressurized air 74 flowing through the passage 338 may thereby remove heat transmitted from the lower housing 102 to the lift plate 308 and return this heat to the heater 100. This heat may include heat from the support assembly heaters 49. The lift plate 308 may thereby operate at a lower temperature than conventional lift plates that lack the passage 338.

The heat absorbed as the air passes through the passage 338 may help pre-heat the pressurized air 74. This pre-heating may reduce the amount of heat that must be provided to the heating blocks 52 by the heating elements 54 as compared to a heater 100 that is mounted to a lift plate without the passage 338. The reduced operating temperature of the lift plate 308 may also lower the operating temperature of the lift assembly 300. This lower lift assembly operating temperature may, in turn, allow the controller board 330 to be housed in the lift assembly 300, thereby reducing the amount of wiring required to couple the controller 50 to the heater blocks 52.

Referring now to FIGS. 12 and 13, in an exemplary application, the heater 100 may be part of a substrate processing system 170 that includes the fluid dispenser 28, the fluid dispenser controller 92, the system controller 94, a conveyor 172, and the lift assembly 300. The system controller 94 may be operatively coupled to the fluid dispenser controller 92, the heater controller 50, a motor 180 configured to move the conveyor 172, and an actuator 182 configured to move the lift plate 308. The actuator 182 may include the pneumatic cylinder 302, which may operate off of house air to provide vertical force to the lift plate 308 in response to signals from the system controller 94. The lift plate 308 may support the heater 100, and may be moved between a raised position (FIG. 12) and a lowered position (FIG. 13) by the actuator 182. The conveyor 172 may include one or more part carriers 184 configured to support and move the substrates 14 between a loading station (not shown), a dispensing station 186, and a heating station 188 in response to activation of the motor 180. The part carriers 184 may include openings 190 located below the substrates 14 that allow air from the heater 100 to impinge directly on the bottom surface 16 of each substrate 14 when the part carrier 184 is positioned in the heating station 188.

The conveyor 172 and lift assembly 300 may be arranged so that in the lowered position the heater 100 is sufficiently spaced from the conveyor 172 to permit the part carrier 184 to move freely in response to activation of the motor 180. When one of the part carriers 184 is positioned above the heater 100, the heater blocks 52 may be brought into close proximity with the substrates 14 by raising the lift plate 308. The heater 100 may thereby be selectively positioned by the system controller 94 so that heated air is impinged on the bottom surfaces 16 of the substrates 14 in response to activation of the heater 100. In an embodiment of the invention, the compliant members 66 of heater blocks 52 may contact the substrates 14 and/or the part carrier 184 when the lift plate 308 is raised, thereby confining the heated air 64 provided by the heater block 52 to an enclosed space between the impingement plate 60 and the bottom surface 16 of substrate 14. This confinement may reduce the air flow rate required to process the substrates 14, thereby reducing the demand for pressurized air 74 as well as the amount of heated air exhausted into the processing facility as compared to heaters lacking the compliant members 66. By reducing the amount of heated air expelled into the processing facility, less energy may be required to heat and compress the air, and to run air conditioning units that cool the processing facility.

In operation, a plurality of substrates 14 to be treated may be placed in an empty part carrier 184 of conveyor 172 at the loading station. This placement may be performed by a robot (not shown), or manually by a technician. In response to a determination that the processing at each of the loading station, dispensing station 186, and heating station 188 is complete, system controller 94 may actuate the motor 180 so that the conveyor 172 moves the loaded part carrier 184 to the dispensing station 186. In response to the part carrier 184 reaching the dispensing station 186, the fluid dispenser controller 92 may cause the fluid dispenser 28 to dispense a fluid material, such as the encapsulant material 26 as described with respect to FIGS. 1 and 2. In response to completion of the dispensing process, the system controller 94 may again actuate the motor 180 and advance the part carrier 184 to the heating station 188.

In response to the part carrier 184 reaching the heating station 188, the system controller 94 may stop the motor 180 and raise the heater apparatus 100 into position by activating the actuator 182. The system controller 94 may then request that the heater controller 50 perform a heating process. This heating process may include adjusting the amount of power provided to the support assembly heater 49, activating the flow control valve 68 to adjust the flow of pressurized air 74 into the plenum 48 of support assembly 46, activation of the air pump 71 of air recovery system 67, and/or adjusting the amount of power provided to each of the heating element assemblies 140 of the heater blocks 52. When the heating process has finished, the heater controller 50 may notify the system controller 94. The system controller 94 may then lower the heater 100 by deactivating the actuator 182, and activate the motor 180 to advance the part carrier 184 to another processing station, such as a cooling station and/or an unloading station (not shown).

When the heater 100 is not actively processing substrates 14, the controller 50 may enter a standby mode. In standby mode, the power provided to the support assembly heater 49 and heating elements 54, and the amount of pressurized air 74 provided by the flow control valve 68 may be reduced while awaiting the next part carrier 184. The heat and airflow may be reduced to levels that conserve energy, but that maintain desired temperatures in the heater blocks 52. By maintaining the operating temperature of each of the heater blocks 52, the heat output of the heater 100 may be quickly ramped up, thereby minimizing any delay in achieving the desired processing temperature for arriving substrates 14.

Figure 14:
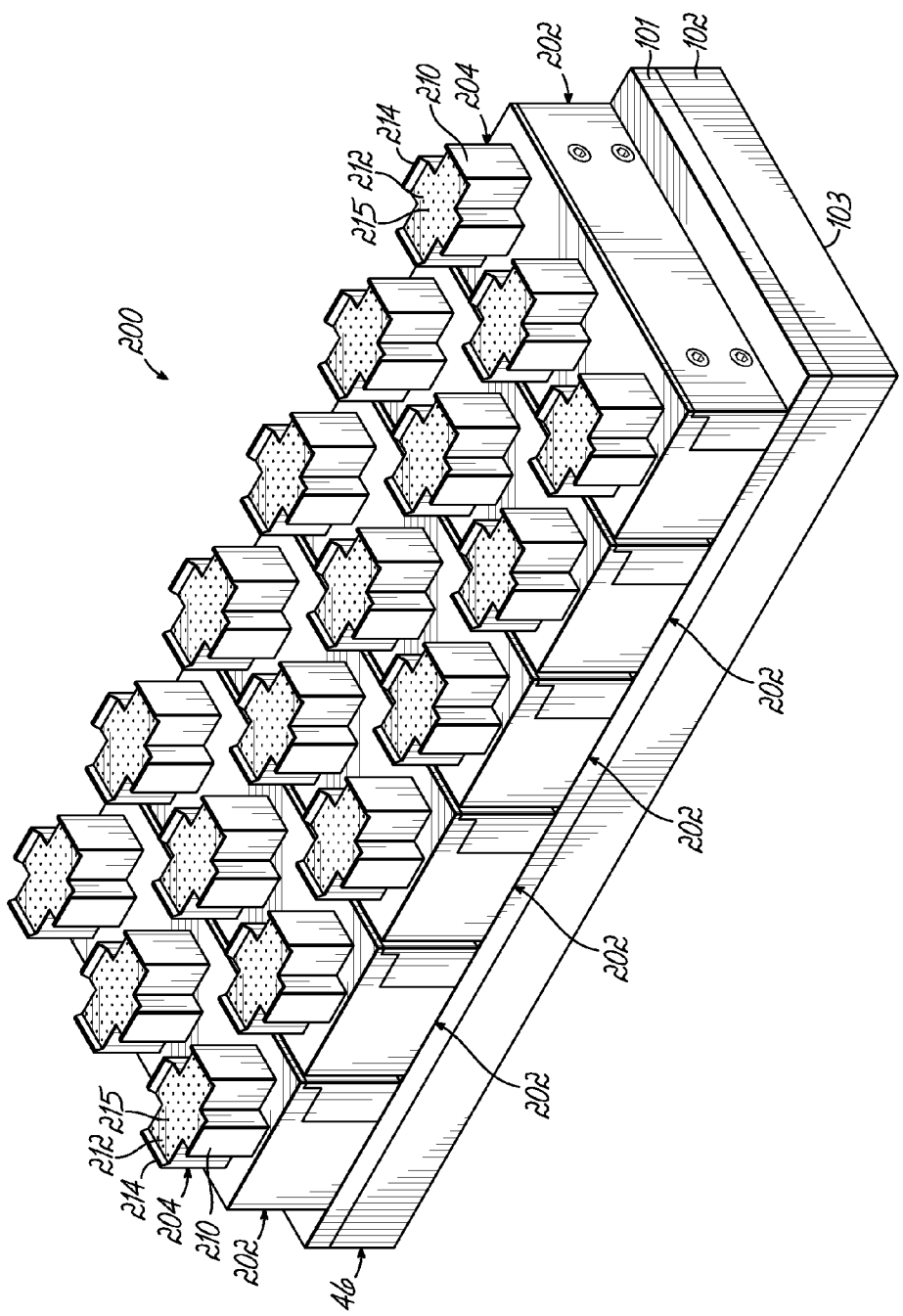
FIG. 14 is a perspective view of an alternative embodiment of a heater.
Figure 15:
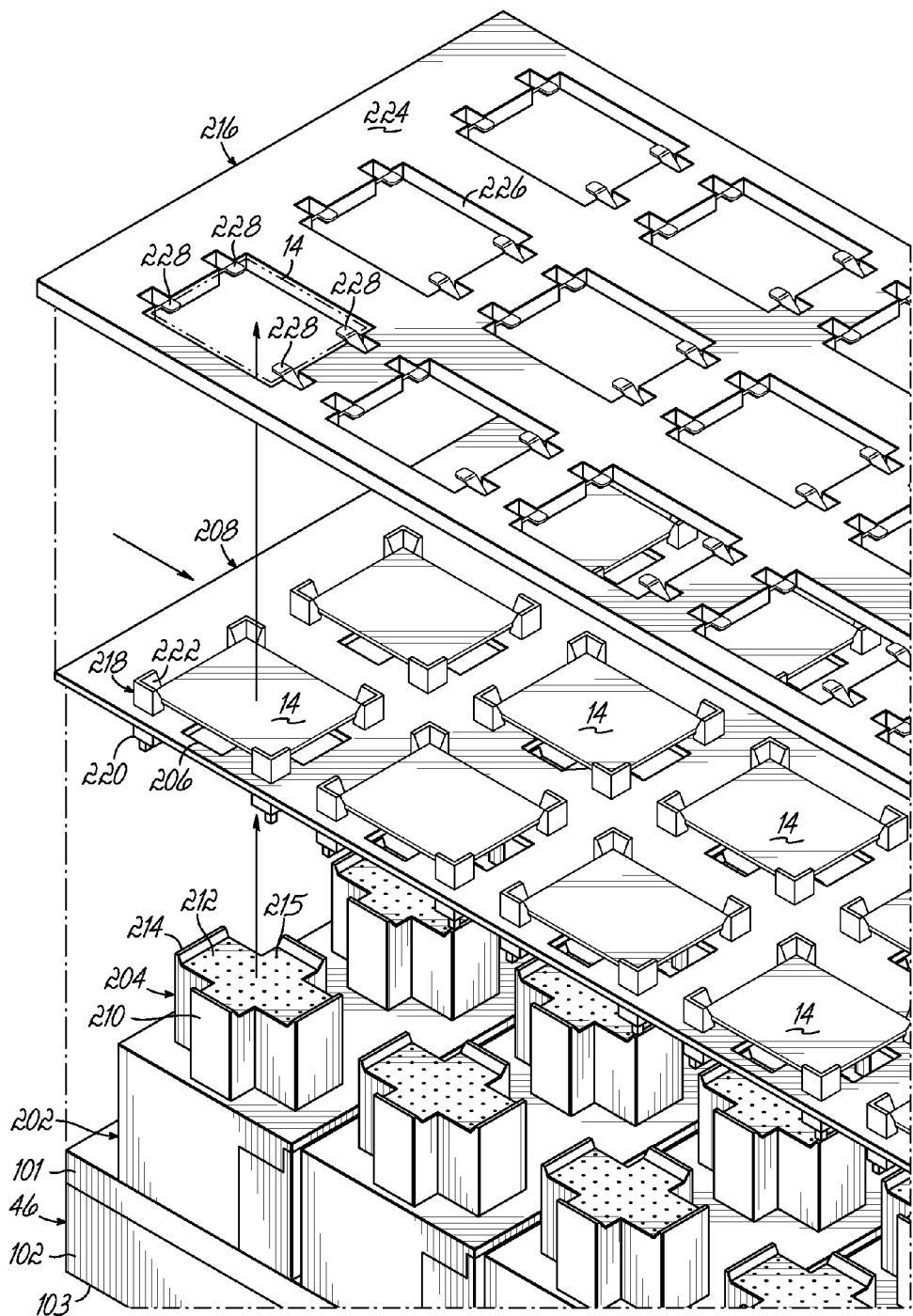
FIG. 15 is a perspective view of the heater in FIG. 14 with a part carrier and frame.

Referring now to FIGS. 14 and 15, in which like reference numerals refer to like features in FIGS. 1-13, and in accordance with an alternative embodiment of the invention, a heater 200 is illustrated that includes a plurality of heater blocks 202 coupled to the support assembly 46. Each of the heater blocks 202 includes a plurality of columns 204 (shown in the exemplary embodiment as three columns) that project upward from the heater blocks 202 and that are configured to engage openings 206 in a part carrier 208. Although three columns 204 each having a horizontal cross-section with an intersecting rectangular shape are illustrated in this exemplary embodiment, persons having ordinary skill in the art will understand that other numbers of columns having various cross-sectional shapes may be used. Embodiments of the invention are therefore not limited to a particular shape or number of columns 204.

Each column 204 may include a vertical portion 210 capped with an impingement plate 212. In an alternative embodiment, the impingement plate 212 may be omitted, in which case the vertical portion 210 of column 204 may have an open end. The vertical portion 210 of column 204 may also include tabs 214 that project above the impingement plate 212. The tabs 214 may define a space or gap between the impingement plate 212 and the substrate 14 when the column 204 is inserted into the opening 206 of part carrier 208. The vertical portion 210 may also define a plenum or other structure (not shown) that fluidically couples heated air from the plenum 48 of support assembly 46 to the impingement plate 212. The heated air coupled to the impingement plate 212 may pass through a plurality of openings 215 in the impingement plate 212 so that a region above the column 204 is supplied with heated air.

The part carrier 208 may be configured to work cooperatively with an upper portion, or frame 216 while positioned in the heating station 188. The openings 206 of part carrier 208 may have shapes configured to receive the columns 204, such as shapes similar to the column cross-sections. A keeper 218 in each corner of the openings 206 may have a lower portion 220 configured to engage the columns 204 during insertion into the openings 206, and a notch 222 configured to support the substrate 14 during loading and transport by the conveyor 172. The frame 216 has a top surface 224 and may include openings 226 that are generally aligned with the openings 206 in the part carrier 208. The openings 226 of the frame 216 may be configured to allow substrates 14 to rise above the top surface 224 of frame 216, and may include spring tabs 228 that prevent the substrates 14 from blowing out of the part carrier 208 and/or frame 216 during heating.

In operation, the part carrier 208 may be loaded with substrates 14. The frame 216 may be placed over the part carrier 208 so that the frame 216 and part carrier 208 travel together as the conveyor 172 moves. In an alternative embodiment, the frame 216 may be located at the heating station 188, and the part carrier 208 positioned in alignment with the frame 216 by the conveyor 172 prior to raising the heater 200 with the lift assembly 300. In either case, the part carrier 208 may be positioned over the heater 200 by the conveyor 172 as described in more detail above with respect to FIGS. 12 and 13. The heating process may be initiated by the system controller 94 activating the lift assembly actuator 182 so that the heater 200 is raised into engagement with the part carrier 208 and frame 216. As the heater 200 is raised, the columns 204 of heater blocks 202 may be inserted into the openings 206 of part carrier 208. The substrates 14 may in turn come into contact with the tabs 214 of columns 204 and be lifted off the keepers 218. The columns 204, part carrier 208, and frame 216 may be configured so that when the heater 200 is in a fully raised position, the substrates 14 are supported from below by the tabs 214 of columns 204 and from above by the spring tabs 228 of frame 216. The spring tabs 228 may thereby provide a restraining force that presses the substrates 14 against the tabs 214 of columns 204 during the heating process. The tabs 214 of column 204 may thereby define a known space or gap between the bottom surface 16 of substrate 14 and the impingement plate 212 of column 204.

In response to the heater 200 being in the fully extended position, the heater controller 50 may provide heated air to the substrates 14 as part of a sequence of steps that define a substrate heating process. Upon termination of the heating process, the heater controller 50 may notify the system controller 94, which in turn may lower the heater 200 and advance the conveyor 172. The system controller 94 may then repeat the treatment cycle to process another batch of substrates 14.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, references herein to terms such as "vertical", "horizontal", etc. are made by way of example, and not by way of limitation, to establish an absolute frame of reference.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

As used herein, the term "in response to" means "in reaction to" and/or "after" a first event. Thus, a second event occurring "in response to" a first event may occur immediately after the first event, or may include a time lag that occurs between the first event and the second event. In addition, the second event may be caused by the first event, or may merely occur after the first event without any causal connection.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of Applicant's general inventive concept.

What is claimed is:

1. An apparatus for processing one or more substrates, the apparatus comprising:
   a heater including a plurality of heater blocks, each heater block including at least one heating element, and each heater block configured to receive pressurized air for heating by the at least one heating element and to exhaust the pressurized air to heat the one or more substrates; and
   a controller coupled with the heater blocks, the controller configured to independently regulate power supplied to the at least one heating element of each heater block for adjusting an amount of heat supplied by the pressurized air from each heater block of the heater to the one or more substrates.

2. The apparatus of claim 1 wherein adjacent pairs of the heater blocks are separated by a gap to provide a non-contacting relationship for thermal isolation.

3. The apparatus of claim 1 wherein each heater block includes a temperature sensor coupled with the controller, the temperature sensor configured to detect a temperature of the heater block and to communicate a signal indicative of the temperature to the controller, and the controller is configured to use the signal for independently regulating the power supplied to the at least one heating element of each heater block.

4. The apparatus of claim 1 wherein the at least one heating element is thermally coupled with the heater block, and the heater block is configured to receive heat from the at least one heating element and to transfer the heat to the pressurized air.

5. The apparatus of claim 1 wherein the heater block includes a plurality of openings from which the pressurized air is exhausted to heat the one or more substrates.

6. The apparatus of claim 5 wherein each heater block includes a plenum that receives the pressurized air and an impingement plate, the openings penetrating through the impingement plate and into the plenum so that the pressurized air is exhausted from the plenum through the impingement plate.

7. The apparatus of claim 5 wherein at least one of the heater blocks includes a compliant member projecting outwardly from the heater block and that peripherally extends about the openings.

8. The apparatus of claim 7 wherein the compliant member is configured to have a contacting relationship with the one or more substrates and includes an aperture that allows the pressurized air to escape from a space between the heater block and the one or more substrates.

9. The apparatus of claim 5 wherein each heater block includes an inlet for receiving the pressurized air and a plurality of air passages that couple the air inlet to the openings so that the pressurized air is heated by heat transferred from the heater block during travel through the air passages from the inlet to the openings.

10. The apparatus of claim 5 wherein the openings are distributed across the heater block for heating two or more substrates.

11. The apparatus of claim 1 further comprising:
    a support assembly configured to support the heater blocks, the support assembly including a plate and a housing joined with the plate to define an air plenum; and
    a first circuit board located in the air plenum, the first circuit board configured to couple the at least one heating element of each heater block with the controller.

12. The apparatus of claim 11 further comprising:
    a lift assembly including a lift plate coupling the support assembly to the lift assembly, the lift plate including an air inlet that receives the pressurized air and a passage that couples the pressurized air from the air inlet to the air plenum so that the pressurized air absorbs heat from the lift plate as the pressurized air flows through the passage.

13. The apparatus of claim 12 further comprising:
    a second circuit board coupled to the lift plate, the second circuit board including the controller, the controller being configured to independently regulate power supplied to the at least one heating element of each heater block by providing control signals to the at least one heating element.

14. The apparatus of claim 11 wherein the first circuit board includes a connector extending through the housing, and the controller is external to the support assembly and coupled with the connector for communicating with the first circuit board to provide control signals to the at least one heating element of each heater block.

15. The apparatus of claim 11 wherein the first circuit board includes a plurality of electrical connectors that are externally accessible through the plate, and the at least one heating element of each heater block is coupled with one of the electrical connectors.

16. The apparatus of claim 11 wherein each heater block is thermally coupled to the at least one heating element and includes an inlet for receiving pressurized air, and the plate includes a plurality of openings for coupling the air plenum of the support assembly with the inlet of each heater block.

17. The apparatus of claim 11 wherein the support assembly further includes a heater coupled to the housing to preheat the pressurized air in the air plenum.

18. The apparatus of claim 1 wherein the heater is further configured to recover at least a portion of the pressurized air exhausted from the heater blocks.

19. The apparatus of claim 18 wherein the heater block includes a first plurality of openings from which the pressurized air is exhausted to heat the one or more substrates, and a second plurality of openings through which the exhausted air is recovered.

20. The apparatus of claim 19 wherein each heater block includes a first plenum that receives the pressurized air, a second plenum that recovers the exhausted air, and an impingement plate, each opening penetrating through the impingement plate and into a respective one of the first and second plenums the so that the pressurized air is exhausted from the positive pressure plenum through the impingement plate, and exhausted air is drawn into the negative pressure plenum through the impingement plate.

21. A method of processing one or more substrates, the method comprising:
    independently adjusting an amount of heat supplied from a first heater and a second heater block to the one or more substrates by:
    receiving pressurized air in the first and second heater blocks;
    heating the first heater block to a first set temperature;
    impinging the one or more substrates over the first heater block with the pressurized air heated by the first heater block;
    heating the second heater block to a second set temperature; and
    impinging the one or more substrates over the second heater block with the pressurized air heated by the second heater block.

22. The method of claim 21 wherein the first and second set temperatures are different.

23. The method of claim 21 further comprising:
monitoring a first actual temperature of the first heater block;
controlling an amount of heat supplied to the first heater block based upon changes in the first actual temperature;
monitoring a second actual temperature of the second heater block; and
controlling an amount of heat supplied to the second heater block based upon changes in the second actual temperature.

24. The method of claim 23 wherein a heating element is used to heat the pressurized air of the first heater block, and controlling the amount of heat supplied to the first heater block based upon changes in the first actual temperature comprises:
regulating power supplied to the heating element to compensate for changes in the first actual temperature and thereby maintain the first actual temperature at the first set temperature.

25. The method of claim 21 wherein impinging the one or more substrates over the first heater block with the pressurized air heated by the first heater block comprises:
directing the pressurized air through a plurality of openings toward the one or more substrates.

26. The method of claim 25 further comprising:
contacting the one or more substrates with a compliant member surrounding the openings that constricts a lateral flow of the pressurized air.

27. The method of claim 21 wherein a pressure of the pressurized air supplied to the first heater block and a pressure of the pressurized air supplied to the second heater block are not independently adjustable.

28. The method of claim 21 wherein the pressurized air is heated by the first heater block by passing the air through a plurality of passages in the first heater block.

29. The method of claim 28 wherein adjusting power supplied to the at least one heating element of the first heater block further comprises:
heating a body of the first heater block with the at least one heating element;
transferring heat from the body to pressurized air inside the body; and
exhausting the pressurized air from the body to heat the one or more substrates over the first heater block.

30. The method of claim 21 further comprising:
recovering at least a portion of the heated pressurized air impinged on the one or more substrates.

31. The method of claim 30 wherein recovering at least a portion of the heated pressurized air impinged on the one or more substrates comprises:
drawing the at least a portion of the heated pressurized air impinged on the one or more substrates through a plurality of openings in at least one of the first and second heater blocks; and
adding the at least a portion of the heated pressurized air impinged on the one or more substrates to the pressurized air.

32. The method of claim 21 further comprising:
passing the pressurized air through a passage in a lift plate, the pressurized air being received in the first heater block after passing through the lift plate so that the pressurized air absorbs heat from the lift plate before being received by the first heater block.

33. The method of claim 21 wherein independently adjusting the amount of heat supplied from each of the heater blocks further comprises:
adjusting power supplied to the at least one heating element of the first heater block; and
adjusting power supplied to the at least one heating element of the second heater block independent of the power adjustment supplied to the at one least heating element of the first heater block.

34. The method of claim 21 further comprising:
dispensing a fluid material on the one or more substrates.

* * * * *